United States Patent [19]

Curtis

[11] Patent Number: 5,358,999
[45] Date of Patent: Oct. 25, 1994

[54] PROCESS FOR PREPARATION OF PHOTOSENSITIVE COMPOSITIONS OF STILBAZOLIUM QUATERNARY

[75] Inventor: John Curtis, Princeton, N.J.

[73] Assignee: Ulano Corporation, Brooklyn, N.Y.

[21] Appl. No.: 42,682

[22] Filed: Apr. 5, 1993

Related U.S. Application Data

[62] Division of Ser. No. 890,238, May 29, 1992, Pat. No. 5,330,877.

[51] Int. Cl.$^5$ ................................................ C08F 8/00
[52] U.S. Cl. ........................................ 525/59; 430/287; 430/270; 430/906; 430/909; 522/149; 525/61
[58] Field of Search .................... 525/59, 61; 430/287, 430/909, 270, 906; 522/149

[56] References Cited

U.S. PATENT DOCUMENTS

| | | | |
|---|---|---|---|
| 2,811,443 | 10/1957 | Robertson et al. | 96/35 |
| 4,287,335 | 9/1981 | Ichimura | 525/61 X |
| 4,339,524 | 7/1982 | Ichimura et al. | 525/61 X |
| 4,777,114 | 10/1988 | Ichimura et al. | 525/61 X |
| 4,891,300 | 1/1990 | Ishimura et al. | 525/59 X |
| 4,920,030 | 4/1990 | Ichimura et al. | 525/61 X |
| 5,021,505 | 6/1991 | Ichimura et al. | 525/61 X |
| 5,061,603 | 10/1991 | Hamilton et al. | 525/59 X |

FOREIGN PATENT DOCUMENTS

| | | | |
|---|---|---|---|
| 1272121 | 7/1968 | Fed. Rep. of Germany . | |
| 0100103 | 6/1982 | Japan | 525/61 |
| 0185035 | 11/1982 | Japan | 525/60 |
| 0129743 | 7/1985 | Japan | 525/60 |

OTHER PUBLICATIONS

Ichimura et al., Journal of Polymer Science: Polymer Chemistry Ed, vol. 18, 891–902 (1980) "Immobilization of Enzymes with Use of Photosensitive Polymers Having The Stilbazolium Group".

*Primary Examiner*—Judy M. Reddick
*Attorney, Agent, or Firm*—Charles E. Baxley

[57] ABSTRACT

Polyvinyl alcohol is modified by reaction with a stilbazol quaternary salt acetal to produce a water soluble polymer capable of photodimerizing on exposure to active radiation to yield water-soluble photoresist materials.

9 Claims, No Drawings

PROCESS FOR PREPARATION OF PHOTOSENSITIVE COMPOSITIONS OF STILBAZOLIUM QUATERNARY

This is a divisional, of application Ser. No. 07/890238, filed May 29 1992, now U.S. Pat. No. 5,330,877.

FIELD OF INVENTION

The present invention relates to photosensitive polymeric materials suitable for the preparation of resists, stencils, relief images, printing plates, photoetching, and inks and more particularly to processes for the preparation of these materials.

THE PRIOR ART

Photosensitive resists can be suitable for a wide variety of uses, including the preparation of several types of printing forms, including screen printing resists, printing plates and resists for the preparation of various stages of circuit board manufacture, as well as UV curable inks and overprint varnishes.

Water soluble or water processable photoresist materials have several advantages, encompassing such aspects as safety in handling, cost, and ease of processing after exposure. Additionally, water soluble or water swellable photopolymer materials can be used in such diverse applications as the manufacture of color and black and white TV screens, and the immobilization of enzymes or living micro organisms. In the last mentioned application, it is an absolute necessity to utilize innocuous materials to prevent damage or destruction of the material under investigation during the immobilization stage.

Water processable systems that have previously been used in one or more applications mentioned above are as follows:

a) Dichromate sensitized water soluble colloids. The use of these materials is diminishing, due to their reliance on toxic metal salts which present severe safety and effluent handling problems as well as the limited shelf life that their "dark reaction" brings to the system.

b) Diazo resins. These are usually diazodiphenylamine/formaldehyde condensation products; they are often utilized in metal free form, and when mixed with a water soluble colloid such as polyvinyl alcohol, can produce excellent results. However, they are somewhat unstable, with a limited shelf-life (especially under warm moist conditions), and their photographic speed is rather slow.

c) Free radical initiated systems. These consist of an initiator capable of forming free radicals when irradiated with actinic light, one or more unsaturated monomers or oligomers that contain vinyl unsaturation, and a water soluble colloid. These systems have a double disadvantage of being both oxygen and moisture sensitive, which can lead to exposure speed variations. They can also be heat sensitive and polymerize when stored at elevated temperatures.

d) Photodimerizable materials. These have the advantage of being fast exposing, and unaffected by moisture, oxygen and heat. The water insoluble variety is best characterized by polyvinylcinnamate.

Water soluble resins based on a styrylpyridinium salt, possessing a formyl or acetal group which is utilized to react with polyvinyl alcohol and so produce a photopolymer that contains Photodimerizable substituents along the polymer chain, have been described, as have chalcone derivatives similarly attached to polyvinyl alcohol. The stilbene derivatives are usually more efficient than the chalcone types.

Photopolymers described in U.S. Pat. Nos. 4,339,524; 4,564,580; 4,272,620 and 4,891,220 and Euro Patents 0 313 220 and 0 373 537 utilize a stilbazolium quaternary based system. However, the connection point to the polyvinyl alcohol is via a formyl or acetal grouping attached to the styryl entity. This severely restricts the capability to modify the absorption characteristics of the chromophore, and hence, all photopolymer compositions within the "family." The styryl grouping makes such a major contribution to the absorption characteristics of the overall molecule, that having to restrict that component of the chromophore by using it as a connecting point to the colloid, drastically limits what advantageous substituents can be incorporated in that part of the molecule. It also places a very severe restriction as to what raw materials can effectively (and practically) be utilized to prepare a photosensitive resins of the particular type described by the aforementioned patents.

In the aforementioned U.S. and Euro patents the photodimerisable entity is usually converted into a salt form to endow the material with additional advantageous properties. However, the compounds disclosed in these patents are structurally very restrictive with regard to freedom of substitution, so they do not allow for the preparation of compounds having a wide range of desirable properties with respect to absorption, activity, solubility and cost.

THE PRESENT INVENTION

The present invention relates to a particular family of photopolymers that possess a high degree of photosensitivity as well as marked solubility in water.

Photosensitive resists can be suitable for a wide variety of uses, including the preparation of several types of printing forms, including screen printing resists, printing plates and resists for the preparation of various stages of circuit board manufacture, as well as UV curable inks and overprint varnishes.

Water soluble or water processable photoresist materials have several advantages, encompassing such aspects as safety in handling, cost, and ease of processing after exposure. Additionally, water soluble or water swellable photopolymer materials can be used in such diverse applications as the manufacture of color and black and white TV screens, and the immobilization of enzymes or living micro organisms. In the last mentioned application, it is an absolute necessity to utilize innocuous materials to prevent damage or destruction of the material under investigation during the immobilization stage.

In accordance with the present invention there are provided photosensitive polymer compounds of the structure:

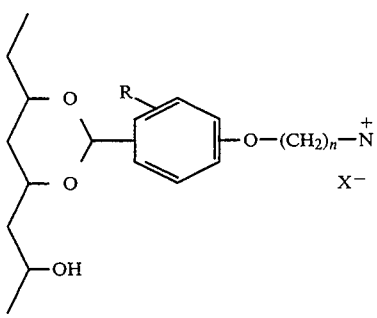

wherein

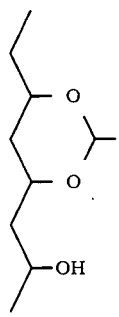

represents a polyvinyl alcohol unit,
R is hydrogen, alkyl, or alkoxy, n is an integer from 1 to 6,

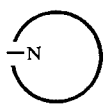

is a radical having the structure

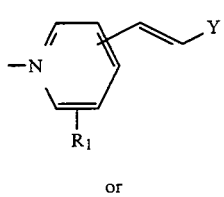

or

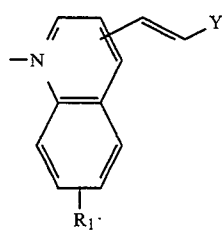

X is an anion, and
Y is a monovalent radical having the structure

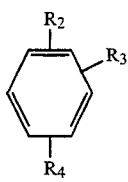

or

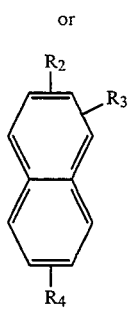

where $R_1$, $R_2$, $R_3$, and $R_4$ are hydrogen, alkyl, alkenyl, alkoxy, aralkyl carboxyl, carboxyl ester, amino, amido, cyano, hydroxy, nitro, isocyanato, sulphonyl halide, sulphonic acid, or halide may be the same or different or $R_2$ and $R_3$ taken together may be methylenedioxy, ethylenedioxy, and the like.

The anion is preferably inorganic and more preferably is halogen.

The alkyl groups in alkyl and alkyl containing groups such as for example, alkoxy and alkylamino preferably contain from 1 to 6 carbon atoms. The alkenyl groups preferably contain from 1 to 6 carbon atoms. Representative compounds of this invention include compounds of the structure:

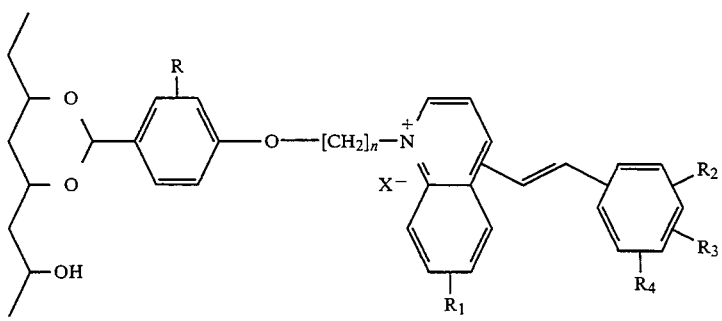

-continued
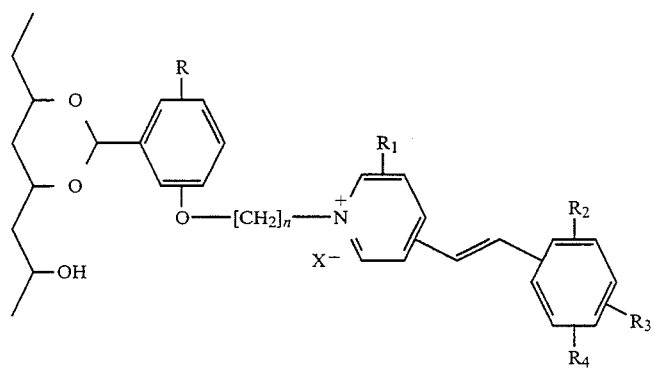
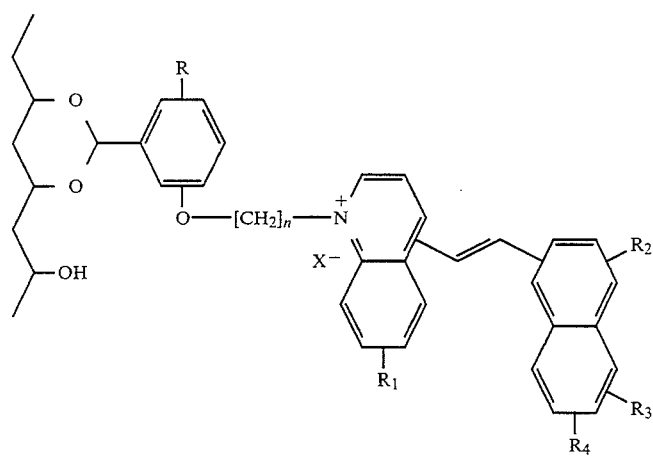
and
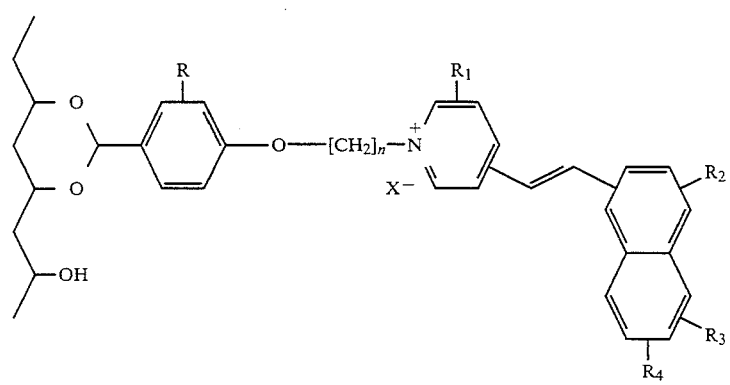
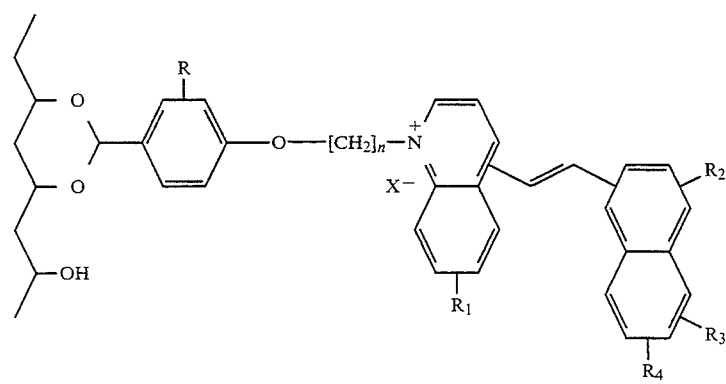
where R, $R_1$, $R_2$, $R_3$, $R_4$, X, and n are the same as above.

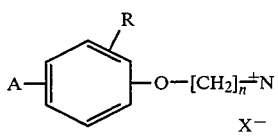

where A is a formyl or acetal group and R, n, X, —N,

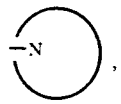

and Y are the same as defined above.

The reaction is usually carried out at a pH of around 2.0 using hydrochloric, sulphuric, phosphoric or an organic sulphonic acid. The reaction is usually carried out at about 70° C. for a period of 4–12 hours. However, the time and temperature can be varied a great deal, if required. The photopolymer may be separated by precipitation in a suitable non solvent [eg acetone], used directly, or after the pH has been ameliorated by use of an ion exchange resin etc.

The invention utilizes a facile and high yield reaction to fabricate the intermediate that is to be utilized as the salt forming, colloid connecting point. Readily available bulk chemicals are able to be used. A specific example of the reaction is as follows:

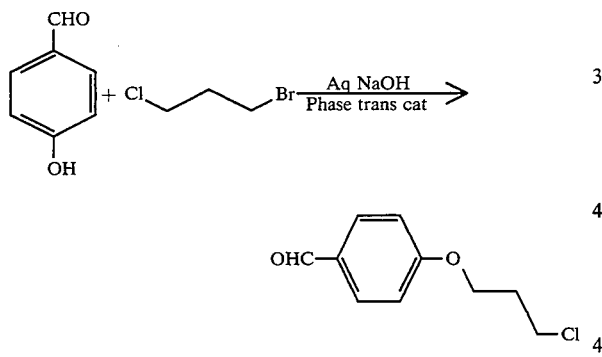

The resultant aldehyde contains an active haloalkyl group which is able to react with a styryl base in a very straightforward and easy fashion, to form a quaternary salt. A specific example of the salt forming reaction is as follows:

Additionally, for the efficiency of the photoreaction, it is highly desirable that the exposed species, [the entity remaining after the photo destruction of the chromophore], does not absorb a similar wavelength to the photoactive chromophore is rapidly destroyed by actinic light. This prevents the surface layer from self-screening or showing a "filtering" effect on the underlying layers.

In addition to being able to easily mix the photodimerizable entities, the photopolymer can be further modified by the addition of non-light sensitive co-reactants during the condensation with polyvinyl alcohol to change the properties of adhesion, solubility, or resistance to solvents or water. Examples of such non-light sensitive co-reactants are acetaldehyde, its dialkyl acetal, chloroacetaldehyde dialkyl acetals, methylaminoacetaldehyde dimethyl acetal, propionaldehyde etc.

The polyvinyl alcohol may be any partially or fully saponified polyvinylacetate, preferably a polyvinyl acetate which is 70 to 99% saponified, and the photopolymers can be prepared by reacting the photodimerizable salt form of the styryl base in an aqueous solution of the polyvinyl alcohol in the presence of an acid catalyst. The reaction is usually carried out at a Ph of around 2.0 using hydrochloric, sulfuric, phosphoric or an organic sulphonic acid. The reaction is usually carried out at about 70° C. for a period of 4–8 hours. However, the time and temperature can be varied a great deal, if required.

The current invention is particularly advantageous in that it allows the entire chromophore to be easily substituted with any group or number of groupings that can advantageously affect the absorption, solubility, activity or even cost of the photopolymer material. In the aforementioned U.S. and Euro patents the photodimerizable entity is converted into a salt form to endow the material with additional advantageous properties. The present invention makes use of a "connecting" entity (one that can react with polyvinyl alcohol) that forms a quaternary salt with the substituted styryl base. This permits freedom of substitution in the styryl ring, in fact the entire chromophore, permitting choice of absorption, activity, solubility and cost. Furthermore it is a simple process to isolate two or more derivatives with very different absorption characteristics and combine them to provide a broader spectrum sensitive product, increasing exposure speed with a wide variety of different exposure sources. The aforementioned patents are very restricted by comparison. The present invention affords water solubility by salt formation, where the

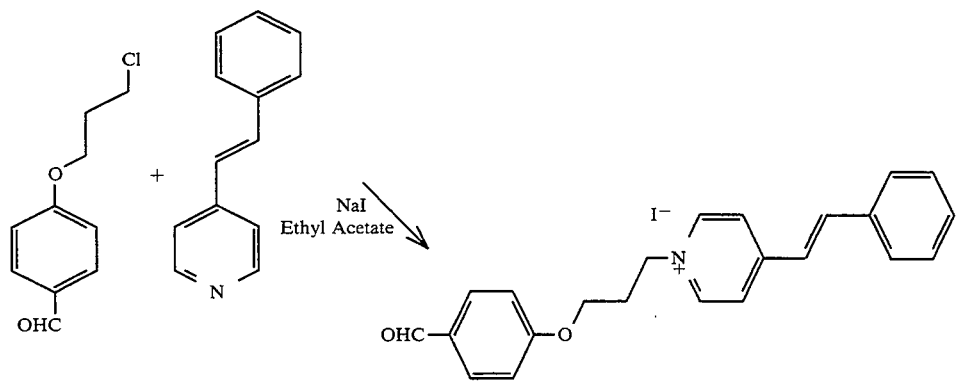

entity that makes the salt is also the connecting point to the colloid.

The photopolymers characterized by the present invention have a very high photoefficiency, allowing thick layers of the photopolymer material to be hardened throughout the entire thickness of the coating, even with a relatively short exposure time to light of a suitable wavelength. They display a faster photospeed than diazo or other systems as described previously. The mechanism of cross-linking in this particular patent is by photodimerisation, and hence none of the photopolymers characterized by the patent, exhibit the susceptibility to oxygen, moisture and temperature of some other systems.

The photodimerizable chromophore need only be present in low concentration, less than 5 mole % based on the polyvinyl alcohol colloid, in order to provide high levels of photosensitivity. Consequently, many of the admirably properties of polyvinyl alcohol (its resistance to a very wide range of solvents, and its ease of degradation with low concentration of an aqueous solution of metaperiodate or bleach) are retained. The photopolymers described in the present invention are suitable for a very wide range of applications, and can be used in both photographic and photochemical processes where a resist, stencil or relief image is required, for example as an etching resist for printing plates, and cylinders, name plates, dials, etc: as resists for plating processes (preparation of printed circuit boards) as ink accepting images for lithographic plates, and as stencils for screen printing stencils. They may also be used in the preparation of photomasks for cathode ray tubes as used in both black and white and color television sets. They can also find use in the preparation of specialized water-based UV curable inks. As previously mentioned, the photopolymers characterized by the present invention can be very easily modified to cover a previously unprecedented range of wavelengths, making them suitable for use with a variety of different laser devices such as used in the direct scanning of lithographic printing plates.

The invention will become clearer from the examples which follow. These examples are given by way of illustration and are not to be considered as limiting.

EXAMPLE 1

4-[4-Chlorostyryl]-Pyridine

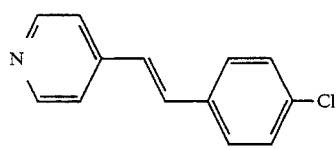

| 4-Picoline | 40 g |
| --- | --- |
| 4-Chloro-Benzaldehyde | 56 g |
| Acetic Anhydride | 70 cc |
| Glacial Acetic Acid | 35 cc | were stirred under reflux for 15 hours, poured on to water with vigorous stirring, filtered, washed with very hot water followed by hexane to give a yellow solid. Air dried.

Yield 68 g

EXAMPLE 2

N-2-[3-Methoxy-4-Formylphenoxyethyl]-4-[3,4-Dimethoxystyryl]-Pyridinium Bromide

| 4-[3,4-Dimethoxystyryl]-Pyridine | 2.4 g |
| --- | --- |
| Ethyl Acetate | 40.0 g |
| 2-[2-Methoxy-4-Formylphenoxyethyl] Bromide | 2.6 g | were stirred under reflux for 24 hours, cooled filtered and washed with ethyl acetate to give a bright yellow solid. Air dried.

Yield 4.5 g

EXAMPLE 3

N-3-[4-Formylphenoxypropyl]-4-[3,4,5-Trimethoxystyryl]-Pyridinium Iodide

| 4-[3,4,5-Trimethoxystyryl]-Pyridine | 5.4 g |
| --- | --- |
| MEK | 50.0 g |
| 3-Chloropropoxy-Benzaldehyde | 4.2 g |
| Sodium Iodide | 3.0 g | were stirred under reflux for 20 hours, cooled, diluted with ethyl acetate, filtered, washed with ethyl acetate and ether. Air dried the yellow solid product.

Yield 9.6 g

EXAMPLE 4

2-[3-Chloropropoxy]-Benzaldehyde

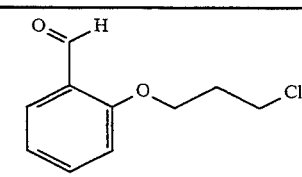

| Salicyaldehyde | 61.0 g |
| --- | --- |
| 1-3-Bromo-Chloro-Propane | 157.0 g |
| Water | 340 cc |
| Tetrabutylammonium Bromide | 3.2 g |
| were refluxed and a solution of | |
| Sodium Hydroxide | 21.0 g |
| Water | 60.0 cc | was added portionwise over a period of 20 minutes. After addition, stirring under reflux was continued for 10 hours. Steam distilled of the excess bromochloro propane, separated the non-aqueous phase and vac distilled, collecting fraction 165°–175° C. under reduced pressure. Pale yellow oil.

Yield 96.4 g

EXAMPLE 5

N-3-[2-Formylphenoxypropyl]-4-Styryl]-Pyridinium Chloride

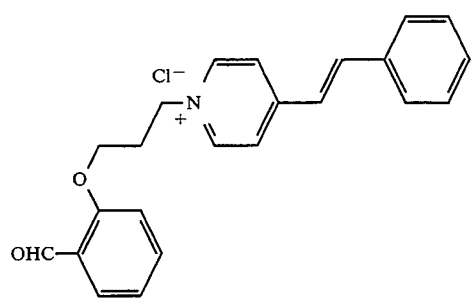

| To a hot solution of | |
|---|---|
| 4-Styryl-Pyridine | 3.6 g |
| Diglyme | 12.0 g |
| was added: | |
| 2-[3-Chloropropoxy-Benzaldehyde | 4.0 g |

Stirred under gentle reflux. A yellow brown solid quickly precipitated. Continued stirring under reflux for a total of 5 hours, cooled and diluted with ethyl acetate, filtered and washed with MEK followed by ether. Air dried the buff/brown solid product.

Yield 6.3 g

7343EXAMPLE 6

4-(4-Methoxystyryl)-pyridine.

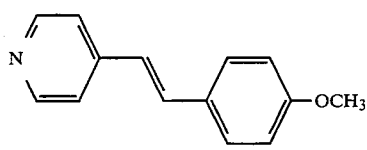

| A mixture containing: | |
|---|---|
| 4-Picoline | 38 g. |
| 4-Anisaldehyde | 55 g. |
| Xylene | 400 cc |
| Dimethylformamide | 32 g |
| p-Toluene-sulfonic acid | 32 g. |

A mixture containing:
4-Picoline 38 g.
4-Anisaldehyde 55 g.
Xylene 400 g.
Dimethylformamide 32 g.
p-Toluene-sulfonic acid 32 g.
were stirred under reflux for 24 hours using a Dean & Stark tube. After reflux approximately 250 cc of xylene/dmf were distilled off. Cooled, added hexane, stirred, filtered and washed with hexane.
Air-dried then washed with:
Water 1 Lit
Warmed watar to near boiling and added portionwise and very carefully:

Anhydrous Sodium Carbonate 25 g
Stirred a t near boiling for 2 hours, checked pH [alkaline], filtered, washed with water, and air dried buff solid product.

Yield 74 g

EXAMPLE 7

Condensation of N-3-[2-Formylphenoxypropyl]-4-styryl]-Pyridinium-Chloride with Vinnol 540 [PVOH]

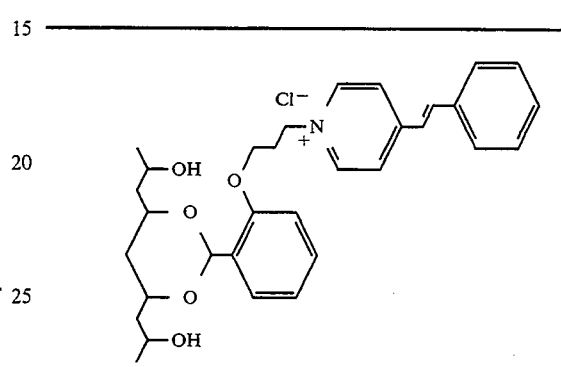

| To Boiling water | 350 cc |
|---|---|
| was added quickly and with vigorous stirring: | |
| Vinnol 540 brand polyvinyl alcohol | 22.0 g | continued vigorous stirring until a complete solution had formed, and the temperature had fallen to about 70° C., and then added the following:

| Conc HCl | 2.0 g |
|---|---|
| Immediately followed by a solution of: | |
| N-3-[2-Formylphenoxypropyl]-4-styryl-Pyridinium-Chloride | 3.8 g |
| Methanol | 30.0 g |

Continued vigorous stirring with sufficient heating to maintain a solution temperature of approximately 65°–75° C. for 7 hours. Added water to give an overall 10% w/w solution and allowed to cool.

Coated the solution on 230 white polyester 1b. Exposed to VNH lamp in steps of 5 units [1 unit=1.2 secs approx].

Easy washout. Excellent stencil; all steps held on resulting in a very good image. VNH is an exposure unit with fluorescent bulbs.

EXAMPLE 8

Condensation of N-2-[2-Methoxy-4-Formylphenoxyethyl]-4 -[3,4-Dimethoxystyryl]-Pyridinium-Bromide with Vinnol 325

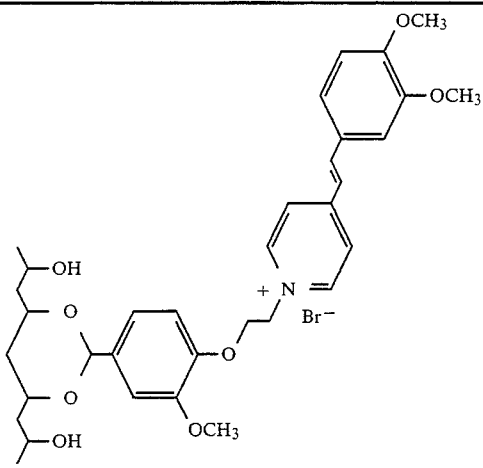

| To Boiling water | 350 cc |
| --- | --- |
| was added quickly and with vigorous stirring: | |
| Vinnol 325 brand polyvinyl alcohol | 22.0 g | continued vigorous stirring until a complete solution had formed and the temperature had fallen to about 70° C., and then added the following:

| Conc HCl | 2.0 g |
| --- | --- |
| Immediately followed by a solution of: | |
| N-2-[2-Methoxy-4-Formylphenoxyethyl]-4-styryl-Pyridinium-Bromide | 4.4 g |
| Methanol | 30.0 g |

Continued vigorous stirring with sufficient heating to maintain a solution temperature of approximately 65°–75° C. for 7 hours. Added water to give an overall 10% w/w solution and allowed to cool.

Coated the solution on 230 white polyester 1b. Exposed to VNH lamp in steps of 5 units [1 unit 32 1.2 secs approx].

Excellent stencil. All steps held on to provide a very good, rather water resistant image.

EXAMPLE 9

Condensation of N-3-[2-Formylphenoxyethyl]-4-styryl-pyridinium-Chloride and Glyoxylic Acid with Vinnol 540 [PVOH]

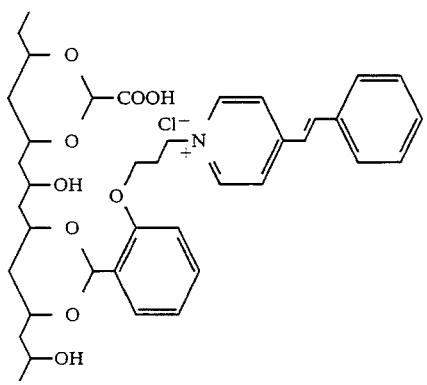

| To Boiling water | 350 cc |
| --- | --- |
| was added quickly and with vigorous stirring: | |
| Vinnol 540 brand polyvinyl alcohol | 22.0 g |

Continued vigorous stirring until a complete solution had formed, and the temperature had fallen to about 70° C. and then added the following:

| Conc HCl | 2.0 g |
| --- | --- |
| Immediately followed by a solution of: | |
| N-3-[2-Formylphenoxypropyl]-4-styryl-Pyridinium-Chloride | 3.8 g |
| Methanol | 30.0 g |
| To the resultant solution was added: | |
| 50% Glyoxylic Acid | 5.0 g |

To the resultant solution was added:
50% Glyoxylic Acid 5.0g

Continued vigorous stirring with sufficient heating to maintain a solution temperature of approximately 65°–75° C. for 7 hours. Added water to give an overall 10% w/w solution and allowed to cool.

Coated the solution on 230 white polyester 1b. Exposed to VNH lamp in steps of 5 units [1 unit =1.2 secs approx].

Washout with a strong water spray. Excellent stencil, all steps held on, image very water resistant with excellent wet strength.

EXAMPLE 10

3-Methoxy-4-[3-Chloropropoxy]-Benzaldehyde

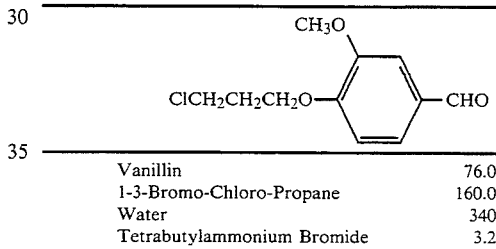

| Vanillin | 76.0 g |
| --- | --- |
| 1-3-Bromo-Chloro-Propane | 160.0 g |
| Water | 340 cc |
| Tetrabutylammonium Bromide | 3.2 g |

To a refluxing solution of the above was added portionwise over a period of 30 minutes a solution of:
Sodium Hydroxide 21.0 g in
Water 60.0 cc After addition, Continued stirring under reflux for 10 hours. Steam distilled off the excess bromochloro propane, separated the non-aqueous phase added cold water and stirred. A white solid precipitated. Filtered washed with water and air dried.
Yield 112 g

EXAMPLE 11

N-3-[2-Methoxy-4-Formylphenoxypropyl]-4-Styryl]-Pyridinium Chloride

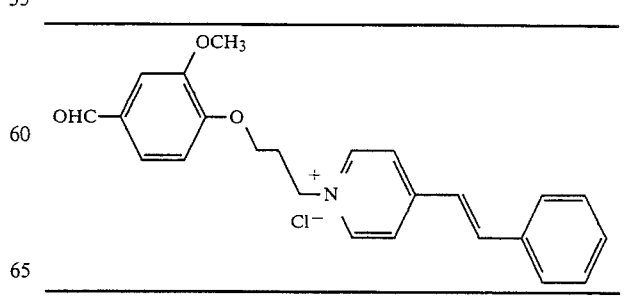

| 4-Styryl-Pyridine | 3.8 g |
| --- | --- |
| Diglyme | 15.0 g |
| 3-Methoxy-4-[3-Chloropropoxy]- | 5.0 g |

-continued

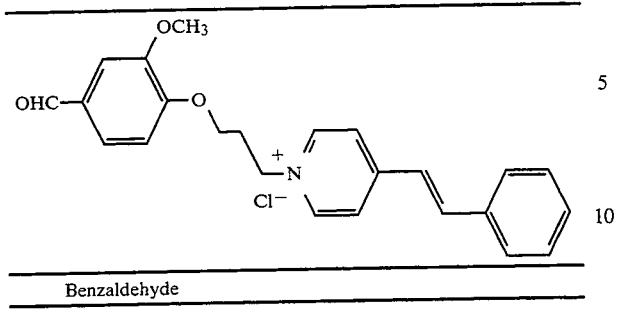

Benzaldehyde were stirred under gentle reflux for 4 hours, cooled and added ethyl acetate and cooled in the freezer. Decanted off the supernatant liquid and dissolved the resultant tarry solid in hot methanol. Carefully added isopropyl acetate to the methanol solution, a pale buff/yellow solid precipitated. Filtered and washed with isopropyl acetate and air dried.

Yield 6.5 g

EXAMPLE 12

Condensation of N-3-[4-Formylphenoxypropyl ]-4-[3,4-Dioxymethylenestyryl]-Pyridinium Chloride with Gohsenol GH23

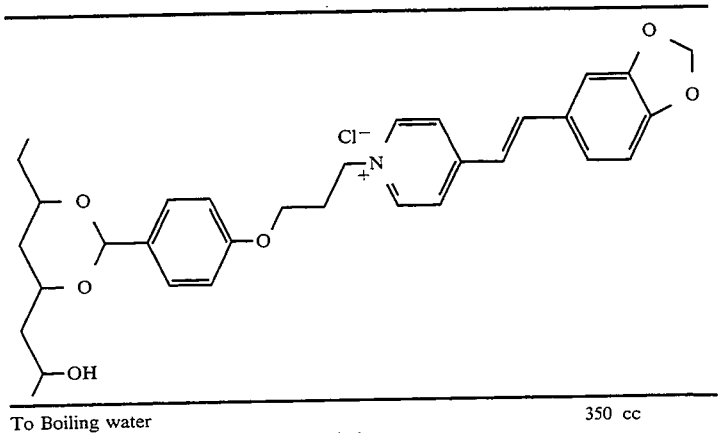

| | |
|---|---|
| To Boiling water<br>was added quickly and with vigorous stirring: | 350 cc |
| Gohsenol GH23, a high molecular weight approximately 88% hydrolyzed polyvinyl acetate obtainable from Nippon Gohsei | 20.0 g |

Continued vigorous stirring until a complete solution had formed, and the temperature had fallen to about 70° C., and then added the following:

| | |
|---|---|
| Conc HCl | 2.0 g |
| Immediately followed by a solution of: | |
| N-3-[4-Formylphenoxypropyl]-4-[3,4-Dioxymethyleneistyryl]-Pyridinium-Chloride | 2.0 g<br>and |
| Methanol | 20.0 g |

Continued vigorous stirring with sufficient heating to maintain a solution temperature of approximately 65°–75° C. for 7 hours. Added water to give an overall 10% w/w solution and allowed to cool.

Coated the solution on 230 white polyester lb. Exposed to VNH lamp in steps of 5 units [1 unit=1.2 secs approx].

A good hard stencil resulted with all exposure steps holding on to the fabric.

Following the procedures given in the above examples and using appropriate intermediated compounds wherein the pyridine moiety,

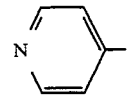

is replaced by another divalent N-containing heterocyclic compound, such as a quinoline, may be prepared.

I claim:

1. A process for preparing a compound having a polymer composition of the structure

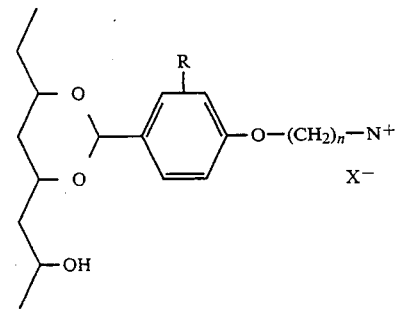

wherein

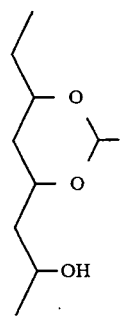

represents a polyvinyl alcohol unit,

R is hydrogen or alkyl having from 1 to 6 carbon atoms or alkoxy having from 1 to 6 carbon atoms, n is an integer from 1 to 6, X is an inorganic anion, and

is a radical having the structure

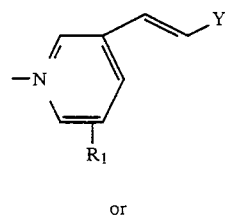

or

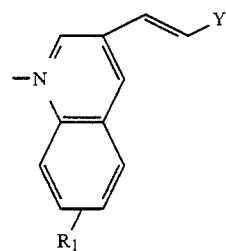

where Y is a monovalent radical having the structure

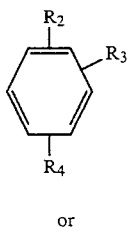

or

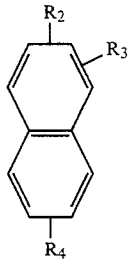

where $R_1$, $R_2$, $R_3$, and $R_4$ are hydrogen, alkyl, alkenyl, alkoxy, aralkyl, carboxyl, carboxyl ester, amino, amido, cyano, hydroxy, nitro, isocyanato, sulfonyl halide, sulfonic acid, halide, "and may be the same or different" or $R_2$ taken together with $R_3$ is methylenedioxy, which process comprises heating under acidic conditions a polyvinyl alcohol and a compound of the structure

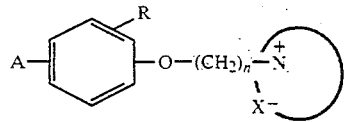

wherein A is a formyl or acetal group and R, n, X and

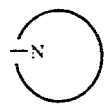

are the same as defined above.

2. The process according to claim 1, wherein the polyvinyl alcohol is a polyvinyl acetate which is 70-99% saponified.

3. The process according to claim 2, which is carried out at a Ph in the range from 1.0 to 4.0.

4. A process according to claim 1, wherein at least one non-light sensitive modifying compound containing a formyl or an acetal group is added to the polyvinyl alcohol and the compound of the structure

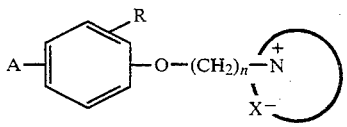

wherein A, R, n and X are the same as defined in claim 1, so as to also condense with the polyvinyl alcohol during the process.

5. The process according to claim 4, wherein one or more of the modifying compounds is selected from acetaldehyde, acetaldehyde dimethyl acetal, acetaldehyde diethyl acetal, chloroacetaldehyde, dimethyl acetal, chloroacetaldehyde, diethyl acetal, or methylaminoacetaldehyde dimethyl acetal.

6. The process according to claim 5, which is carried out in the presence of a catalyst selected from phosphoric acid, hydrochloric acid, sulfuric acid, p-toluene sulphonic acid, methane sulphonic acid, butane sulphonic acid, or benzene sulphonic acid.

7. The process according to claim 6, which is carried out at a temperature in the range 15°-100° C. and in a time range from 2 to 100 hours.

8. A process according to claim 7, which is carried out so that the

the portion of the molecule is present at a concentration from 0.5-20 mole % based on the polyvinyl alcohol, said

being defined as in claim 1.

9. The process according to claim 8, wherein the ratio of the
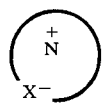
portion of the molecule to the polyvinyl alcohol is 8.2 to 44.0 on a weight basis.
* * * * *